(12) United States Patent
Chen et al.

(10) Patent No.: US 10,937,674 B2
(45) Date of Patent: Mar. 2, 2021

(54) METHOD FOR TRANSFERRING MICRO DEVICE

(71) Applicant: MIKRO MESA TECHNOLOGY CO., LTD., Apia (WS)

(72) Inventors: Li-Yi Chen, Tainan (TW); Fang-Chi Chien, Nantou County (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 71 days.

(21) Appl. No.: 16/391,333

(22) Filed: Apr. 23, 2019

(65) Prior Publication Data

US 2019/0252222 A1 Aug. 15, 2019

Related U.S. Application Data

(63) Continuation-in-part of application No. 15/896,007, filed on Feb. 13, 2018, now Pat. No. 10,643,880.

(51) Int. Cl.
*H01L 21/67* (2006.01)
*H01L 23/00* (2006.01)
(Continued)

(52) U.S. Cl.
CPC ........ *H01L 21/67144* (2013.01); *B65G 47/90* (2013.01); *H01L 24/08* (2013.01);
(Continued)

(58) Field of Classification Search
CPC .............. B65G 47/90; H01L 2224/97; H01L 21/67144; H01L 21/6835; H01L 2924/00014; H01L 21/67721; H01L 2221/68368; H01L 2224/808; H01L 2224/838; H01L 21/02513; H01L 21/447; H01L 21/449; H01L 21/52; H01L 21/67778; H01L 21/6838; H01L 21/786; H01L 2224/08225; H01L 2224/80001; H01L 2224/80085; H01L 2224/80894; H01L 2224/83; H01L 24/08; H01L 24/80; (Continued)

(56) References Cited

U.S. PATENT DOCUMENTS 4,606,962 A * 8/1986 Reylek ................ C09J 7/10
428/148
6,878,607 B2 * 4/2005 Inoue .................. H01L 21/2007
438/458
(Continued)

FOREIGN PATENT DOCUMENTS

WO WO-02063678 A1 * 8/2002 ............. H01L 24/75

*Primary Examiner* — Sonya M Sengupta
(74) *Attorney, Agent, or Firm* — CKC & Partners Co., LLC

(57) ABSTRACT

A method for transferring a micro device is provided. The method includes: preparing a carrier substrate with the micro device thereon, wherein an adhesive layer is between and in contact with the carrier substrate and the micro device; picking up the micro-device from the carrier substrate by a transfer head; forming a liquid layer on a receiving substrate; and placing the micro device over the receiving substrate by the transfer head such that the micro device is in contact with the liquid layer and is gripped by a capillary force; and moving the transfer head away from the receiving substrate such that the micro device is detached from the transfer head and is stuck to the receiving substrate.

9 Claims, 9 Drawing Sheets

(51) Int. Cl.
| | |
|---|---|
| *B65G 47/90* | (2006.01) |
| *H01L 21/02* | (2006.01) |
| *H01L 21/447* | (2006.01) |
| *H01L 21/52* | (2006.01) |
| *H01L 21/786* | (2006.01) |
| *H01L 21/683* | (2006.01) |
| *H01L 21/449* | (2006.01) |
| *H01L 21/677* | (2006.01) |
| *H01L 27/15* | (2006.01) |
| *H01L 33/00* | (2010.01) |

(52) U.S. Cl.
CPC ............. *H01L 24/80* (2013.01); *H01L 24/97* (2013.01); *H01L 21/02513* (2013.01); *H01L 21/447* (2013.01); *H01L 21/449* (2013.01); *H01L 21/52* (2013.01); *H01L 21/786* (2013.01); *H01L 2221/68322* (2013.01); *H01L 2221/68354* (2013.01); *H01L 2221/68368* (2013.01); *H01L 2221/68381* (2013.01); *H01L 2224/08225* (2013.01); *H01L 2224/7598* (2013.01); *H01L 2224/75725* (2013.01); *H01L 2224/75735* (2013.01); *H01L 2224/75745* (2013.01); *H01L 2224/80004* (2013.01); *H01L 2224/808* (2013.01); *H01L 2224/80085* (2013.01); *H01L 2224/80097* (2013.01); *H01L 2224/80894* (2013.01); *H01L 2224/80986* (2013.01); *H01L 2224/83* (2013.01); *H01L 2224/83002* (2013.01); *H01L 2224/838* (2013.01); *H01L 2224/83097* (2013.01); *H01L 2224/83986* (2013.01); *H01L 2224/95136* (2013.01); *H01L 2224/95146* (2013.01); *H01L 2224/97* (2013.01); *H01L 2924/00014* (2013.01); *H01L 2924/14* (2013.01)

(58) Field of Classification Search
CPC ......... H01L 27/153; H01L 2924/12041; H01L 2924/14; H01L 2924/1461; H01L 33/0095; H01L 2221/68322; H01L 2221/68354; H01L 2221/68381; H01L 2224/75725; H01L 2224/75735; H01L 2224/75745; H01L 2224/7598; H01L 2224/80004; H01L 2224/80097; H01L 2224/80986; H01L 2224/83002; H01L 2224/83097; H01L 2224/83986; H01L 2224/95136; H01L 2224/95146; H01L 24/97
USPC ....................................... 156/235
See application file for complete search history.

(56) References Cited

U.S. PATENT DOCUMENTS

| | | | |
|---|---|---|---|
| 8,333,860 B1* | 12/2012 | Bibl | .................. H01L 21/67144 |
| | | | 156/249 |
| 10,312,218 B1* | 6/2019 | Chen | ....................... H01L 24/32 |
| 2002/0036055 A1* | 3/2002 | Yoshimura | .......... H01L 21/6835 |
| | | | 156/234 |
| 2004/0154733 A1* | 8/2004 | Morf | ....................... H01L 24/75 |
| | | | 156/241 |
| 2012/0292775 A1* | 11/2012 | Nakamura | .............. H01L 24/83 |
| | | | 257/773 |
| 2016/0111395 A1* | 4/2016 | Heinrich | .......... H01L 23/49503 |
| | | | 257/724 |

* cited by examiner

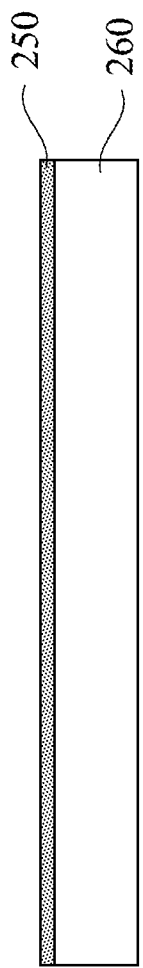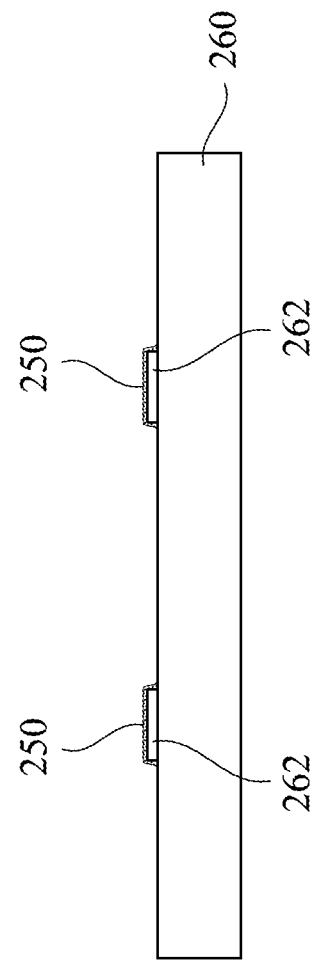
Fig. 4A
Fig. 4B

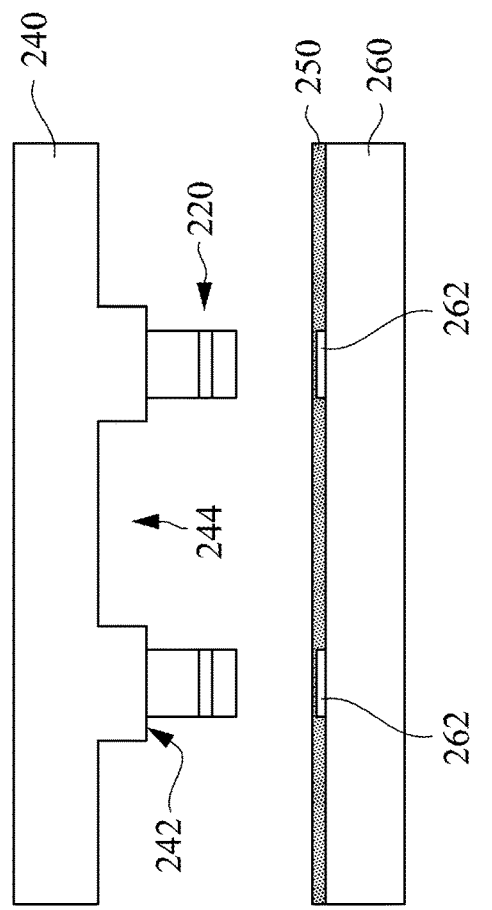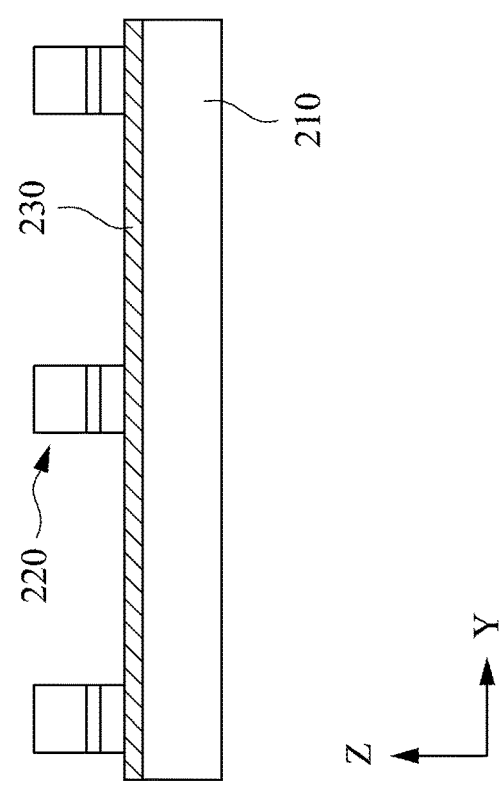
Fig. 5A ated of U.S. application Ser. No. 15/896,007, filed Feb. 13,

METHOD FOR TRANSFERRING MICRO DEVICE

RELATED APPLICATIONS

The present application is a continuation-in-part application of U.S. application Ser. No. 15/896,007, filed Feb. 13, 2018, which is herein incorporated by reference.

BACKGROUND

Field of Invention

The present disclosure relates to a method for transferring a micro device from a carrier substrate to a receiving substrate.

Description of Related Art

The statements in this section merely provide background information related to the present disclosure and do not necessarily constitute prior art.

Traditional technologies for transferring of devices include transfer by wafer bonding from a transfer wafer to a receiving substrate. One such implementation is "direct bonding" involving one bonding step of an array of devices from a transfer wafer to a receiving substrate, followed by removal of the transfer wafer. Another such implementation is "indirect bonding" which involves two bonding/de-bonding steps. In indirect bonding, a transfer head may pick up an array of devices from a donor substrate, and then bond the array of devices to a receiving substrate, followed by removal of the transfer head.

SUMMARY

According to some embodiments of the present disclosure, a method for transferring a micro device is provided. The method includes: preparing a carrier substrate with the micro device thereon, wherein an adhesive layer is between and in contact with the carrier substrate and the micro device; picking up the micro-device from the carrier substrate by a transfer head; forming a liquid layer on a receiving substrate; placing the micro device over the receiving substrate by the transfer head such that the micro device is in contact with the liquid layer and is gripped by a capillary force; and moving the transfer head away from the receiving substrate such that the micro device is detached from the transfer head and is stuck to the receiving substrate.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows:

FIG. 4A is a schematic cross-sectional view of an intermediate step of the method for transferring the micro device in some embodiments of the present disclosure;

FIG. 4B is a schematic cross-sectional view of an intermediate step of the method for transferring the micro device in some embodiments of the present disclosure;

FIG. 5A is a schematic cross-sectional view of an intermediate step of the method for transferring the micro device in some embodiments of the present disclosure;

DETAILED DESCRIPTION

Figure 1:
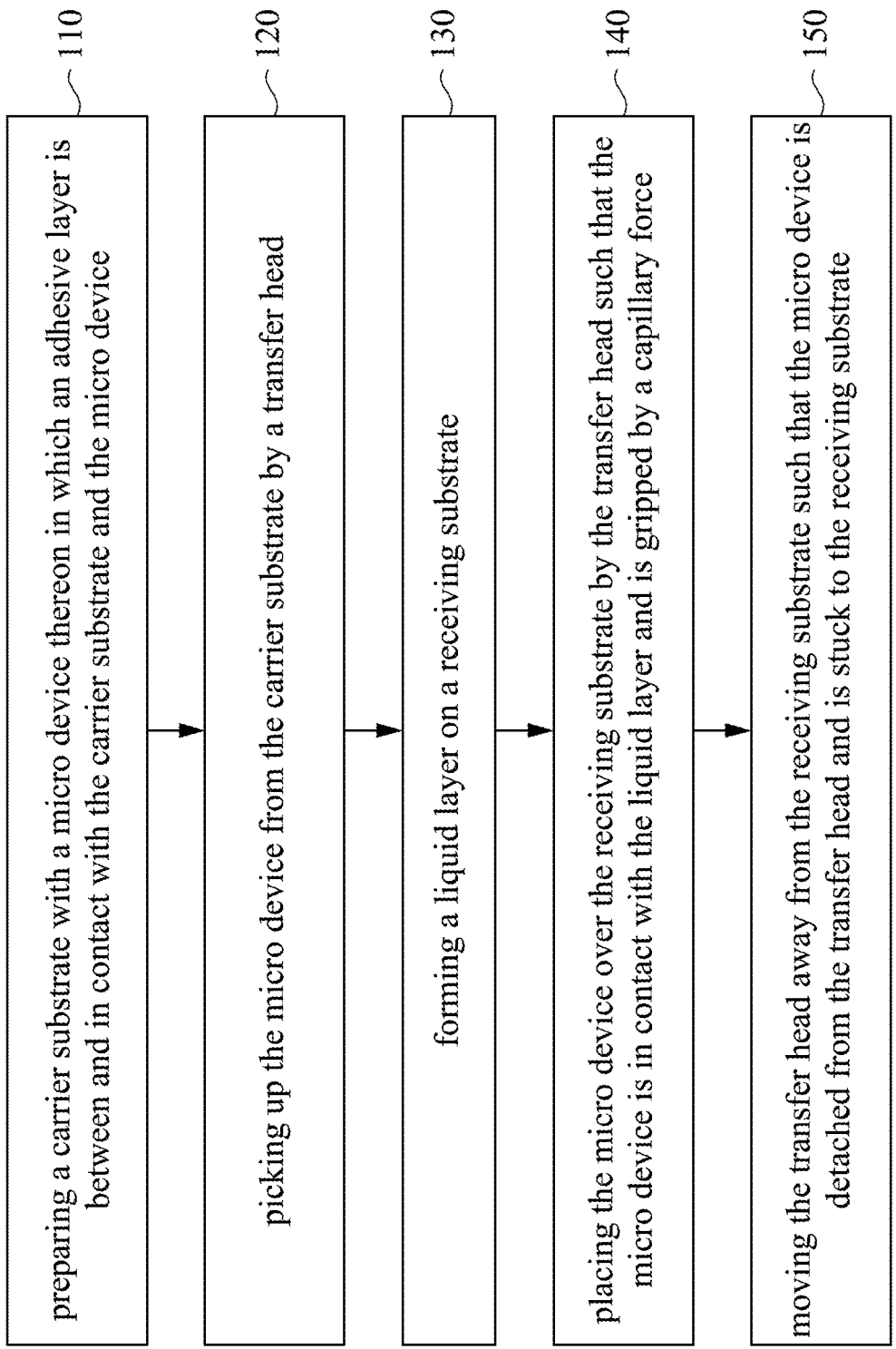
FIG. 1 is a flow chart of a method for transferring a micro device from a carrier substrate to a receiving substrate in some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment" or the like means that a particular feature, structure, configuration, or characteristic described in connection with the embodiment is included in at least one embodiment of the disclosure. Thus, the appearances of the phrase "in one embodiment," "in an embodiment" or the like in various places throughout this specification are not necessarily referring to the same embodiment of the disclosure. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

FIG. 1 is a flow chart of a method for transferring a micro device from a carrier substrate to a receiving substrate. FIGS. 2 to 7B are schematic cross-sectional views of intermediate steps of the method 100 of FIG. 1. References are made to FIGS. 1 to 7B. The method 100 begins with operation 110 in which a carrier substrate 210 is prepared with a micro device 220 thereon. An adhesive layer 230 is between and in contact with the carrier substrate 210 and the micro device 220 (as referred to FIG. 2). The method 100 continues with operation 120 in which the micro device 220 is picked up from the carrier substrate 210 by a transfer head 240 (as referred to FIG. 3). The method 100 continues with operations 130 and 140 in which a liquid layer 250 or a patterned liquid layer 250 is formed on a receiving substrate 260 (as referred to FIGS. 4A and 4B), and then the micro device 220 which has been picked up is placed over the receiving substrate 260 by the transfer head 240, such that the micro device 220 is in contact with the liquid layer 250 and is gripped by a capillary force produced by the liquid layer 250 (as referred to FIGS. 5A, 5B, and 6). The method 100 continues with operation 150 in which the transfer head 240 is moved away from the receiving substrate 260 such that the micro device 220 is detached from the transfer head 240 and is stuck to the receiving substrate 260 (as referred to FIGS. 7A and 7B).

Although in the previous paragraph and FIG. 1 only "a" micro device 220 is mentioned, "multiple" micro devices 220 may be used in practical applications and is still within the scope of the present disclosure, as will be illustrated in the following embodiments.

Figure 2:
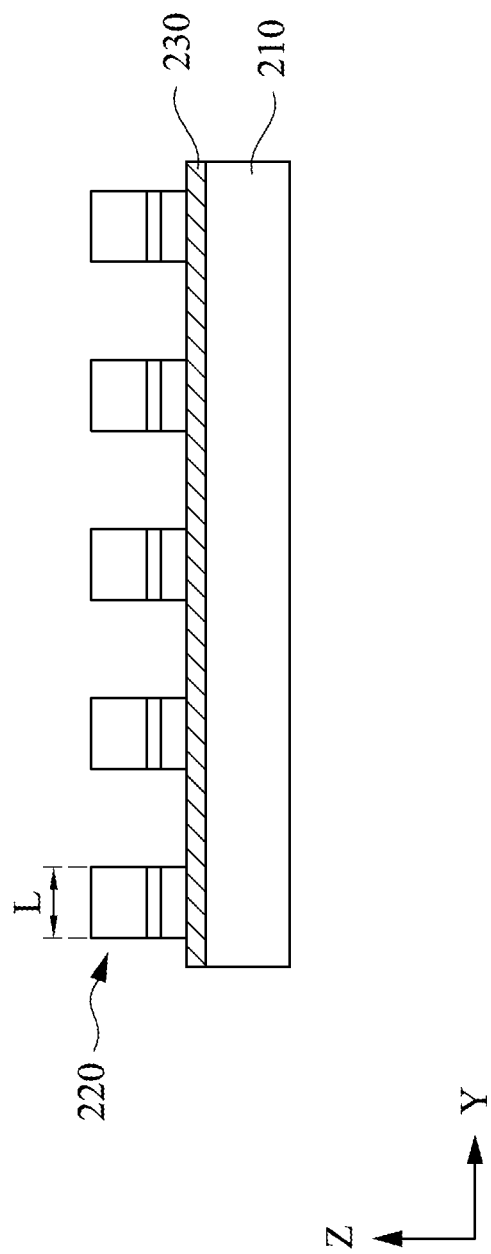
FIG. 2 is a schematic cross-sectional view of an intermediate step of the method for transferring the micro device in some embodiments of the present disclosure.

Reference is made to FIG. 2. As mentioned above, the adhesive layer 230 is between the carrier substrate 210 and a plurality of micro devices 220. Specifically, the adhesive layer 230 is in contact with the carrier substrate 210 and the micro devices 220. In some embodiments, the formation of the adhesive layer 230 is performed by coating an adhesive capable material onto the carrier substrate 210. The adhesive layer 230 may be coated by a spin coater, a slit coater, or any combination thereof. In some embodiments, the adhesive layer 230 may be made of an adhesion capable organic material, such as epoxy, polymethylmethacrylate (PMMA), polysiloxanes, silicone, or any combination thereof. Furthermore, the adhesive layer 230 may have a thickness in a range from about 1 μm to about 100 μm.

An adhesive force F1 is an adhesive force of the adhesive layer 230 to each of the micro devices 220, and has a value F11. In some embodiments, The adhesive force F1 is the adhesive force of the adhesive layer 230 to each of the micro devices 220 after reduction, and has a value F12. In some embodiments, the value F11, which is a value of the adhesive force F1 without said reduction, is greater than the value F12. Said reduction is reducing an original adhesive force of the adhesive layer 230 to each of the micro devices 220, which may be performed before some of the micro devices 220 are picked up. In some embodiments, the reduction may be performed by heating, cooling, applying an electric field, an electromagnetic radiation, ultrasound, a mechanical force, a pressure, or any combination thereof on the adhesive layer 230, and should not be limited thereto. In some embodiments, a lateral length L of one of the micro devices 220 is about less than or equal to about 50 μm. Said lateral length is measured in a direction Y. The direction Y is perpendicular to a thickness direction Z, and the thickness direction Z is perpendicular to a planar extension direction of the carrier substrate 210. For example, for one micro device 220 with a surface area about 10 μm×10 μm, said reduced adhesive force F1 has the value F12 about 50 nanonewton (nN). Embodiments of this disclosure are not limited thereto. Proper modifications to the adhesive layer 230 depending on an actual application may be performed. The adhesive force F1 may include van der Waals forces, but should not be limited thereto.

In some embodiments, the carrier substrate 210 may be a rigid substrate. The rigid substrate may be made of glass, quartz, silicon, polycarbonate (PC), acrylonitrile butadiene styrene (ABS), or any combination thereof. Embodiments of this disclosure are not limited thereto. Proper modifications to the carrier substrate 210 depending on an actual application may be performed.

In some embodiments, the micro devices 220 may be a light emitting structure such as a compound semiconductor having a bandgap corresponding to a specific region in the spectrum. For example, the light emitting structure may include one or more layers based on II-VI materials (e.g. ZnSe, ZnO) or III-V nitride materials (e.g. GaN, AlN, InN, InGaN, GaP, AlInGaP, AlGaAs or alloys thereof). In some other embodiments, the micro devices 220 may also be integrated circuits (IC) or microelectromechanical system (MEMS) devices, and should not be limited thereto.

Figure 3:
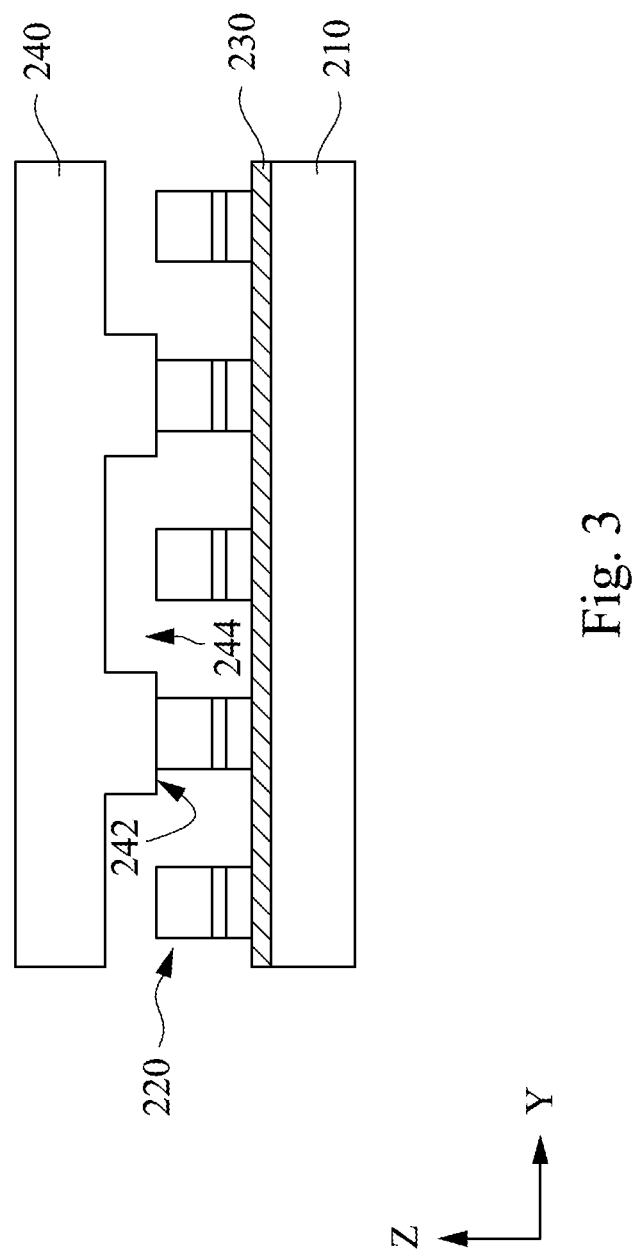
FIG. 3 is a schematic cross-sectional view of an intermediate step of the method for transferring the micro device in some embodiments of the present disclosure.

Reference is made to FIG. 3. As mentioned above, some of the micro devices 220 are picked up from the carrier substrate 210 by the transfer head 240. In some embodiments, the transfer head 240 may exert a picking-up pressure or a picking-up force on each of the micro devices 220 by way of, for example, vacuum, adhesion, magnetic attraction, electrostatic attraction, or the like. Hereinafter only adhesive force will be discussed, but other types of forces mentioned above are still within the scope of the present disclosure. In some embodiments, the transfer head 240 may have a plurality of grip regions 242 for picking up and placing the micro devices 220. There may also be recesses 244 among the grip regions 242 configured as a place accommodating objects not to be picked up and/or placed. Besides, when performing the placing of the micro devices 220 on the receiving substrate 260, objects that are originally on the receiving substrate 260 will not be interfered. There may also be recesses 244 among the grip regions 242. The grip regions 242 of the transfer head 240 may be made of an adhesion capable material or, the transfer head 240 may have a patterned adhesive layer thereon, such that when the transfer head 240 is in contact with the micro devices 220, each of the micro devices 220 may be picked up by an adhesive force F2. In some embodiments, for one micro device 220 with a surface area about 10 μm×10 μm, said adhesive force F2 is about 100 nN to 1000 nN for one micro device 220. The adhesive force F2 may include van der Waals forces, but should not be limited thereto.

As mentioned above, in some embodiments, the original adhesive force F1 with the value F11 may be reduced before the picking up to form the adhesive force F1 with the value F12, so that a difference between the adhesive force F2 and the adhesive force F1 is increased so as to facilitate the performance of picking up the micro devices 220.

Reference is made to FIGS. 4A and 4B. As mentioned above, the liquid layer 250 is formed on the receiving substrate 260. The liquid layer 250 may be formed as one layer on the receiving substrate 260 as shown in FIG. 4A or patterned to be discrete portions on the receiving substrate 260 as shown in FIG. 4B. In FIG. 4B the patterned liquid layer 250 can be where the micro devices 220 will be placed over. The receiving substrate 260 can be a display substrate, a lighting substrate, a substrate with functional devices such as transistors or integrated circuits, or a substrate with metal redistribution lines, but should not be limited thereto. In some embodiments, the liquid layer 250 may be formed by lowering a temperature of the receiving substrate 260 in an environment including a vapor, such that at least a part of the vapor is condensed to form the liquid layer 250 on the receiving substrate 260. Specifically, the liquid layer 250 or the patterned liquid layer 250 may be formed on conductive pads 262 of the receiving substrate 260, but should not be limited thereto. In some embodiments, an area of each of the conductive pad 262 is smaller than or equal to about 1 millimeter square. In some embodiments, the temperature of the receiving substrate 260 is lowered to about dew point, such that the water vapor in the environment is condensed to form liquid water serving as the liquid layer 250. Furthermore, the formation of the liquid layer 250 may also be achieved by showering a vapor, inkjet printing, roller coating, dip coating, or the like.

Figure 5B:
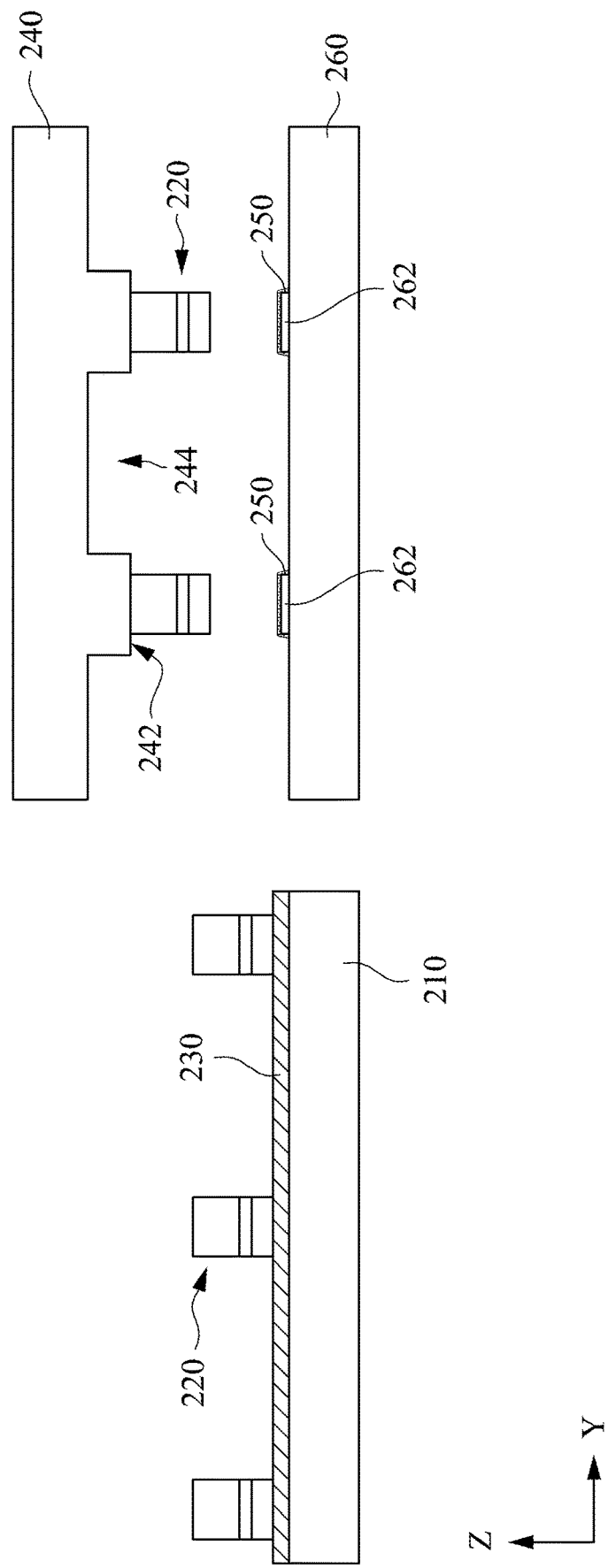
FIG. 5B is a schematic cross-sectional view of an intermediate step of the method for transferring the micro device in some embodiments of the present disclosure.
Figure 6:
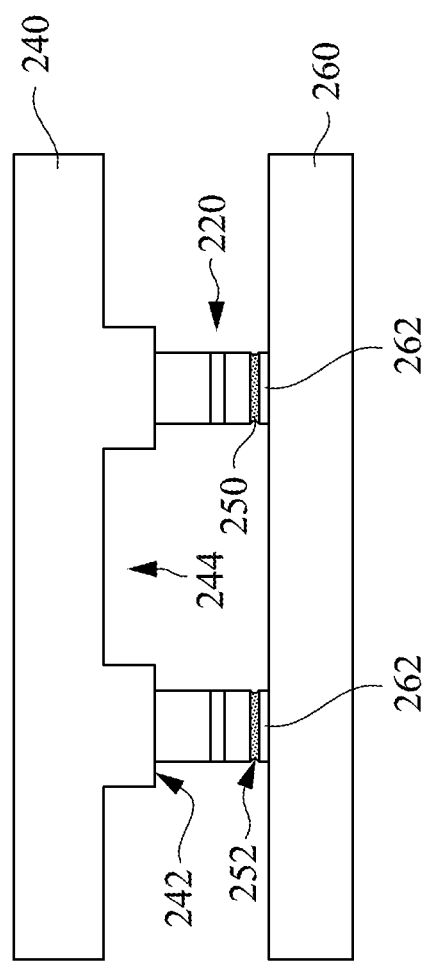
FIG. 6 is a schematic cross-sectional view of an intermediate step of the method for transferring the micro device in some embodiments of the present disclosure.

References are made to FIGS. 5A, 5B and 6. As mentioned above, the micro devices 220 which have been picked up are placed over the receiving substrate 260 by the transfer head 240, such that each of the micro devices 220 is in contact with the liquid layer 250 and gripped by a capillary force F31. Specifically, the micro devices 220 are placed in close proximity to the conductive pads 262, such that the liquid layer 250 can grip the micro devices 220. The meniscuses 252 of the liquid layer 250 as shown in FIG. 6 are caused by the capillary force F31. The micro devices 220 are gripped by the capillary force F31 produced by the liquid layer 250 between the micro devices 220 and the conductive pad 262. In some embodiments, a thickness of the liquid layer 250 is less than a thickness of the micro devices 220 when the micro devices 220 are gripped by the capillary force F31. It is noted that a sequence of operation 130 and operation 140 can be exchanged. That is, the micro devices 220 can be placed onto and in contact with the conductive pads 262 and then the liquid layer 250 is formed on the receiving substrate 260.

Figure 7A:
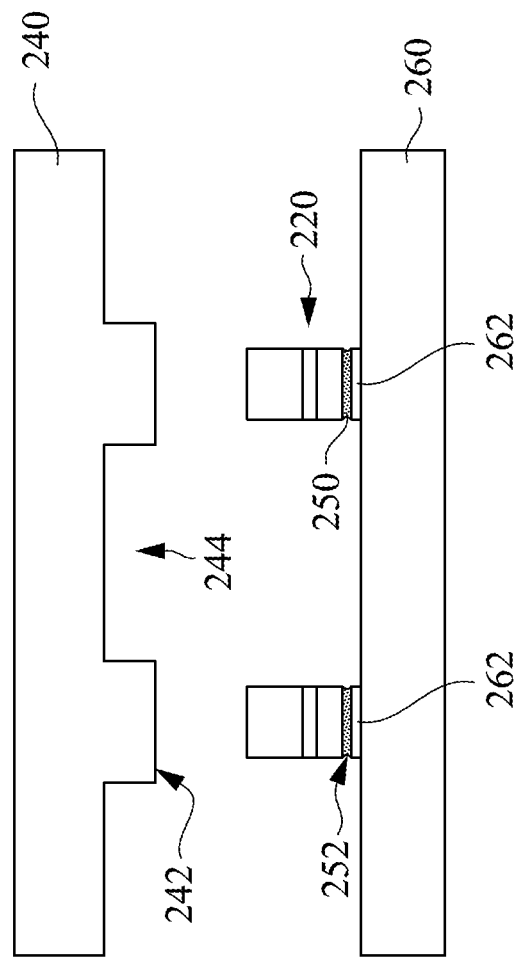
FIG. 7A is a schematic cross-sectional view of an intermediate step of the method for transferring the micro device in some embodiments of the present disclosure.
Figure 7B:
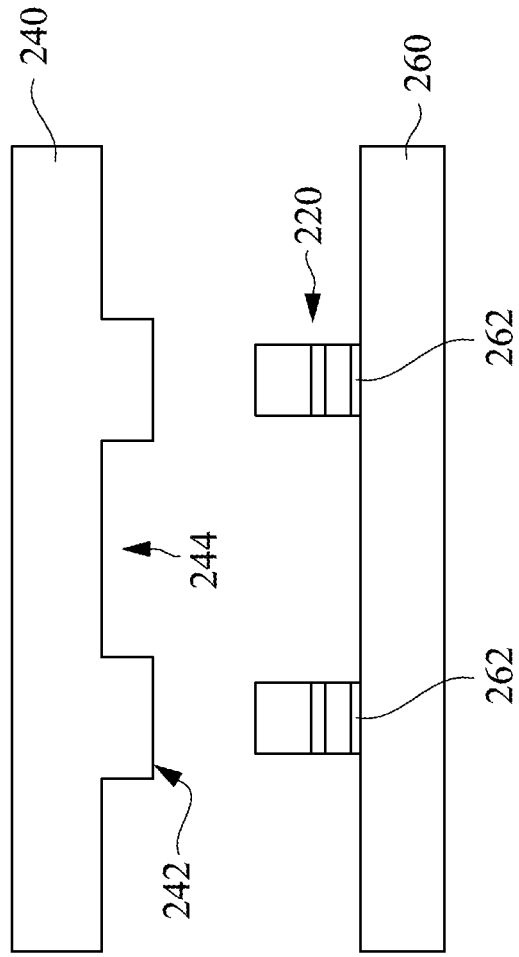
FIG. 7B is a schematic cross-sectional view of an intermediate step of the method for transferring the micro device in some embodiments of the present disclosure.

Reference is made to FIGS. 7A and 7B. As mentioned above, the micro devices 220 are detached from the transfer head 240 after the micro devices 220 are gripped by the capillary force F31. In some embodiments, the micro devices 220 are adhered to the adhesive layer 230 by an adhesive force F1 with the value F11 or the value F12 as mentioned above. Some of the micro devices 220 are attached to the transfer head 240 by the adhesive force F2, and the capillary force F31 is greater than the adhesive force F2 such that the micro devices 220 are detached from the transfer head 240 and are stuck to the receiving substrate 260 when the transfer head 240 is moved away from the receiving substrate 260 after said placing as illustrated by in FIG. 7A.

In some embodiments, the method 100 further includes evaporating the liquid layer 250 such that at least one of the micro devices 220 is bound to one of the conductive pads 262 and is in electrical contact with the conductive pad 262. The evaporation of the liquid layer 250 may be achieved by, for example, raising a temperature of the receiving substrate 260 or the conductive pads 262. The micro devices 220 may have electrodes thereon respectively for electrically contacting the conductive pads 262. In some embodiments, the transfer head 240 is moved away from the receiving substrate 260 before the liquid layer 250 is evaporated. Under this circumstance, a force F3 for overcoming the adhesive force F2 is the capillary force F31 as mentioned above, and the capillary force F31 is greater than the adhesive force F2. In some embodiments, the transfer head 240 is moved away from the receiving substrate 260 after the liquid layer 250 is evaporated. Under this circumstance, the force F3 for overcoming the adhesive force F2 is a sticking force F32 between one of the micro devices 220 and one of the conductive pads 262 produced after said evaporation, and the sticking force F32 is greater than the adhesive force F2.

In some embodiments, the method 100 further includes lowering the temperature of the receiving substrate 260 or the conductive pad 262 such that the liquid layer 250 is frozen before the transfer head 240 is moved away from the receiving substrate 210 as mentioned above. When the liquid layer 250 is frozen, another grip force F33 produced by the frozen liquid layer 250 is applied to the micro devices 220. Generally, the grip force F33 is greater than the adhesive force F2.

In some embodiments, a combination of the transfer head 240, the micro devices 220, the liquid layer 250, and the receiving substrate 260 is heated to form a bonding between the micro devices 220 and the receiving substrate 260 via a bonding force F34 therebetween before the transfer head 240 is moved away from the receiving substrate 260. The bonding force F34 is greater than the adhesive force F2.

In short, the force F3 includes one of the following forces: (1) the capillary force F31 produced by the liquid layer 250 between the micro devices 220 and the conductive pads 262; (2) the sticking force F32 between the micro devices 220 and the conductive pads 262 in which a difference between (1) and (2) depends on whether the liquid layer 250 is evaporated; (3) the grip force F33 produced by the frozen liquid layer 250; and (4) the bonding force F34 between the micro devices 220 and the receiving substrate 260 after heating.

In some embodiments, lateral lengths of the micro devices 220 are less than or equal to 50 μm. The limitation on the lateral lengths is to ensure feasibility of the above embodiments because some forces such as the capillary force F31 caused by the liquid layer 250, the sticking force F32 caused by interfaces between the micro devices 220 and the conducive pads 262 after evaporating the liquid layer 250 therebetween, and the grip force F33 caused by the frozen liquid layer 250 may be greatly changed according to the lateral lengths of the micro devices 220. It is noted that an influence of the capillary force F31, the sticking force F32, and the grip force F33 on the micro devices 220 will gradually dominate other forces applied to the micro devices 220 when sizes (e.g., the lateral lengths) of the micro devices 220 gradually scale down. Besides, gravitational forces need to be considered if the lateral lengths of the micro devices 220 are too great, which is not desirable for implementing some embodiments disclosed in the present disclosure. In the above embodiments, at least one of the capillary force F31, the sticking force F32, and the grip force F33 is greater than the adhesive force F2 due to a size effect (i.e., smaller lateral lengths) of the micro devices 220.

More specifically, the forces applied to the micro devices 220 with the lateral length within the range mentioned in these embodiments will obey one of the following inequalities:

$$F11 < F2 < F31 \tag{1}$$

$$F11 < F2 < F32 \tag{2}$$

$$F11 < F2 < F33 \tag{3}$$

$$F11 < F2 < F34 \tag{4}$$

$$F12 < F2 < F31 \tag{5}$$

$$F12 < F2 < F32 \tag{6}$$

$$F12 < F2 < F33 \tag{7}$$

$$F12 < F2 < F34 \tag{8}$$

wherein the left-hand side of inequalities (1) to (8): F11<F2 and F12<F2 may be satisfied by choosing suitable combination of materials for the adhesive layer 230 and surfaces of the grip regions 242 in contact with the micro devices 220.

Table 1 lists various forces mentioned heretofore:

TABLE 1

| Symbols | Meaning |
|---|---|
| F1 | adhesive force of the adhesive layer 230 to the micro device 220 |
| F11 | F1 without reducing an original adhesive force of the adhesive layer 230 |
| F12 | F1 after reducing the original adhesive force of the adhesive layer 230 |
| F2 | adhesive force exerted by the transfer head 240 to the micro device 220 |
| F3 | a force attaching the micro device 220 to the receiving substrate 260 |
| F31 | a capillary force produced by the liquid layer 250 |
| F32 | a sticking force between the micro device 220 and the conductive pad 262 produced after evaporating the liquid layer 250 |
| F33 | a grip force produced by the frozen liquid layer 250 |
| F34 | a bonding force after the formation of bonding between the micro device 220 and the receiving substrate 260 |

Generally, the adhesive forces F1 (including the value F11 and the value F12) and the adhesive force F2 per unit area do not change when lateral lengths of the micro devices 220 are changed. In some embodiments, the adhesive force F2 may be additionally modified by the speed of moving up the transfer head 240 away from the carrier substrate 210 after the transfer head 240 is in contact with the micro devices 220. The faster the speed is, the greater the adhesive force F2 is. As such, transfer processes mentioned above may be achieved with adhesive type transfer head 240. Complicated circuit designs or mechanical designs for transfer heads operated by electrostatics force, vacuum force, mechanical force, or any combination thereof can be omitted. An adhesive type transfer head 240 is capable of completing the transfer processes, and the cost of the processes is reduced.

In the above embodiments supported by FIGS. 1 to 7B, after some of the micro devices 220 are placed over the receiving substrate 260, the micro devices 220 are gripped by the capillary force F31 produced by the liquid layer 250 between the micro devices 220 and the conductive pads 262, the sticking force F32 between the micro devices 220 and the conductive pads 262 produced after said evaporating, the grip force F33 produced by the frozen liquid layer 250, and/or the bonding force F34 after the combination of the transfer head, the micro device, the liquid layer, and the receiving substrate are heated to form the bonding between the micro devices 220 and the receiving substrate 260, and then the micro devices 220 are detached from the transfer head 240 and being transferred to the receiving substrate 260. As such, an adhesive type transfer head 240 without complicated circuit design is capable of completing the transfer processes due to the presence of the liquid layer 250, and the cost of the processes are reduced.

In summary, a method for transferring a micro device from a carrier substrate to a receiving substrate by an adhesive type transfer head is provided. As such, the transfer process is simplified by a simple mechanism of transferreing.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the method and the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method for transferring a micro device, comprising:
   preparing a carrier substrate with the micro device thereon, wherein an adhesive layer is between and in contact with the carrier substrate and the micro device;
   picking up the micro device from the carrier substrate by a transfer head;
   forming a liquid layer on a receiving substrate;
   placing the micro device over the receiving substrate by the transfer head such that the micro device is in contact with the liquid layer and is gripped by a capillary force; and
   moving the transfer head away from the receiving substrate such that the micro device is detached from the transfer head and is stuck to the receiving substrate,
   wherein the micro device is adhered to the adhesive layer by a first adhesive force, the micro device is attached to the transfer head by a second adhesive force, the first adhesive force and the second adhesive force comprise van der Waals forces, and the capillary force is greater than the first adhesive force and the second adhesive force such that the micro device is detached from the transfer head and is stuck to the receiving substrate when the placing is performed.

2. The method of claim 1, wherein the second adhesive force is greater than the first adhesive force.

3. The method of claim 1, wherein a lateral length of the micro device is less than or equal to 50 μm.

4. The method of claim 1, further comprising:
   evaporating the liquid layer such that the micro device is bound to a conductive pad of the receiving substrate and is in electrical contact with the conductive pad before the micro device is detached from the transfer head, wherein a force attaching the micro device to the conductive pad is a sticking force produced after said evaporating.

5. The method of claim 4, wherein the micro device comprises an electrode thereon, and the micro device is bound to and in electrical contact with the conductive pad via an electrode.

6. The method of claim 4, wherein the sticking force is greater than the first adhesive force and the second adhesive force.

7. The method of claim 4, wherein an area of the conductive pad is smaller than or equal to about 1 millimeter square.

8. The method of claim 1, further comprising lowering a temperature of the receiving substrate such that the liquid layer is frozen before moving the transfer head away from the receiving substrate.

9. The method of claim 1, further comprising:
   heating a combination of the transfer head, the micro device, the liquid layer, and the receiving substrate to form a bonding between the micro device and the receiving substrate via a bonding force therebetween before the transfer head is moved away from the receiving substrate.

* * * * *